United States Patent [19]

Dobbs et al.

[11] Patent Number: 5,566,237
[45] Date of Patent: Oct. 15, 1996

[54] TIME ZONE EQUALIZER

[75] Inventors: James F. Dobbs, Irving, Tex.; Kevin S. Christian, Seattle, Wash.

[73] Assignee: Dobbs-Stanford Corporation, Dallas, Tex.

[21] Appl. No.: 191,512

[22] Filed: Feb. 3, 1994

[51] Int. Cl.⁶ .................................................. H03G 5/00
[52] U.S. Cl. ......................................... 381/103; 333/28 R
[58] Field of Search .................................. 455/181.1, 267, 455/171.1; 333/28 T, 28 R; 381/101, 102, 103, 98

[56] References Cited

U.S. PATENT DOCUMENTS

| | | |
|---|---|---|
| 2,650,272 | 8/1953 | Gavigan . |
| 3,315,167 | 4/1967 | Goldwasser . |
| 4,024,411 | 5/1977 | Bengoa . |
| 4,079,366 | 3/1978 | Wong . |
| 4,184,050 | 1/1980 | Yuter . |
| 4,228,543 | 10/1980 | Jackson . |
| 4,279,012 | 7/1981 | Beckedorff et al. . |
| 4,292,467 | 9/1981 | Odlen et al. .................... 381/101 |
| 4,306,115 | 12/1981 | Humphrey . |
| 4,363,001 | 12/1982 | Suzuki et al. .................... 381/101 |
| 4,368,408 | 1/1983 | Marcus . |
| 4,570,216 | 2/1986 | Chan . |
| 4,635,121 | 1/1987 | Hoffman et al. ............... 455/181.1 |
| 4,641,344 | 2/1987 | Kasai et al. . |
| 4,644,106 | 2/1987 | Yeh . |
| 4,954,899 | 9/1990 | Tanabe et al. ................ 455/181.1 |
| 5,081,707 | 1/1992 | Schorman et al. . |
| 5,241,696 | 8/1993 | Mori et al. ........................ 381/101 |

Primary Examiner—Forester W. Isen
Attorney, Agent, or Firm—David W. Carstens; Strasburger & Price

[57] ABSTRACT

An audio selection circuit (10) having time selectable equalization, comprising a plurality of inputs (24, 26) for coupling the audio selection circuit to a plurality of audio signal sources, a variable equalization circuit (32) having an equalization input and an equalization output, the variable equalization circuit (32) providing variable attenuation in a plurality of frequency bands to an audio signal coupled to the equalization input, processing means (12) operatively coupled to the plurality of inputs (24, 26) and to the variable equalization circuit (32), memory means (12) operatively coupled to the processing means (12) and timebase means (14) operatively coupled to the processing means (12), the timebase means (14) enabling the processing means (12) to determine a time of day, wherein the processing means (12) is operative to couple one of the plurality of inputs (24, 26) to the equalization input and to vary the attenuation of the variable equalization circuit (32) when the time of day is equal to or past a stored time of day stored in the memory (12), the coupling of one of the plurality of inputs (24, 26) and the varying of the attenuation being done according to parameters stored in the memory. Other systems, devices and methods are disclosed.

12 Claims, 9 Drawing Sheets

5,566,237

TIME ZONE EQUALIZER

TECHNICAL FIELD OF THE INVENTION

The present invention relates generally to audio selection and control circuits, and more particularly to audio selection circuits with time selectable equalization.

BACKGROUND OF THE INVENTION

In many places, particularly in commercial establishments such as a restaurant or bar, it is desirable to provide audio and/or video broadcast to the occupants. Additionally, it may be desirable to change the source of the broadcast at various times during the day, such as changing radio stations, switching from audio broadcast to television broadcast or vice versa, or switching to prerecorded audio or video sources. Such changes may be made manually, but this method has several serious drawbacks. First, it requires that the restaurant personnel, who likely have several other duties to perform, remember when it is time to change the program source. If it is desired to switch, for example, from an audio source to a video source at a particular time in order to broadcast a sporting event to the patrons of the restaurant or bar, if it is not remembered to switch the program source in time, the patrons may be displeased. Secondly, there is no control to keep unauthorized personnel from altering the audio or video selection in a way that may be displeasing to the patrons, such as playing objectionable material or increasing the volume of "favorite songs." Lastly, most hired labor in restaurants and bars do not have the requisite skills necessary to properly adjust the tone controls of sophisticated stereo equipment in ways that are particularly advantageous to the given listening environment and purpose of the broadcast.

In a commercial establishment such as a restaurant or bar, where the audio and/or video source is used to enhance the ambiance, the above described problems can have devastating consequences. For example, in restaurants, the second most common reason that patrons don't return (the number one reason being bad service), is that the music was too loud, or conversely, that it was not loud enough to cover the conversation and other noises near the patron. In such service oriented businesses, these types of problems can result in failure of the business. Proper use of the volume and tone controls on the selected audio or video source can enhance the ambiance of the listener's environment. For example, when a restaurant is very busy, such as during peak breakfast, lunch and dinner hours, there will be a distracting amount of noise created by the restaurant serving noises and the general din of a roomful of conversation. Proper control of the volume and tone controls on the program source can be used to mask such noises while promoting conversation. For example, the music may be equalized to lower the volume in the audio frequencies in the range of the human voice while increasing the volume in the low and high ends of the audio spectrum. This gives the listener the pleasant sensation of talking in a fairly quiet room, while the music covers the restaurant serving noises in the low and high frequency ranges. This equalization scheme also gives considerable abatement to noise from adjoining tables.

The "in between" diners after lunch typically read or are in a hurry, so the overall volume of the program source should be lowered, and the equalization profile in the frequency range of the human voice is increased in order to promote a sense of privacy in the listeners. Alternatively, in a bar, the equalization in the voice frequencies should be raised slightly in the early evening to encourage louder, more social conversation. Later in the evening, the voice frequencies can be lowered in volume in order to encourage the continuation of softer conversation.

Such equalization control may also be used to advantage in business environments, where the equalization profile can be used to cover annoying machinery sounds, used to make sales conversation easy, or employed to make conversation more difficult where, such as on an assembly line, discouraging conversation leads to greater accuracy of work.

Prior art audio and/or video controllers have proven unsatisfactory to handle all of the above problems adequately. Most such prior art devices comprise some sort of clock timer, usually a twenty-four hour timer, which may be programmed to select different audio and/or video sources at various times of the day. Because these device merely switch from one program source to another, they have no provision for preventing restaurant personnel from altering the characteristics of the source, such as volume and tone controls, or even the tuned broadcast source, such as the radio or television station. Additionally, such devices merely switch the program sources into and out of connection with a central speaker system, and therefore cannot dynamically alter the tone controls (and hence the equalization profiles) of the program sources.

There is therefore a need in the prior art for a device that is capable of automatically selecting from among a plurality of available program sources for broadcast through an attached speaker and/or video system while controlling the equalization profile of the program source. There is a further need for providing such a system that cannot be altered by unauthorized users. The present invention is directed toward meeting these needs.

SUMMARY OF THE INVENTION

It is therefore the object of the present invention to provide a control device that may be programmed to select between a plurality of attached audio and/or video sources depending upon the time of day and/or the day of week.

It is a further object of the present invention to provide a controller that may be programmed to control the equalization profile and volume of a selected broadcast source.

It is a further object of the present invention to provide a controller that may be programmed to select between a plurality of attached audio and/or video sources depending upon the time of day and to control the equalization profile and volume of a selected broadcast source from a remote location.

Finally, it is an object of the present invention to prevent unauthorized persons from altering the program of an automatic audio and/or video controller.

In order to meet the forgoing objectives and to overcome the problems inherent in the prior art devices, the present invention incorporates a novel programmable equalization circuit that allows the equalization profile of the selected audio and/or video source to be altered at selected times of the day.

In one form of the invention, an audio selection circuit having time selectable equalization is disclosed, comprising a plurality of inputs for coupling the audio selection circuit to a plurality of audio signal sources, a variable equalization circuit having an equalization input and an equalization output, the variable equalization circuit providing variable attenuation and/or boost in a plurality of frequency bands to an audio signal coupled to the equalization input, processing means operatively coupled to the plurality of inputs and to the variable equalization circuit, memory means operatively coupled to the processing means and timebase means operatively coupled to the processing means, the timebase means enabling the processing means to determine a time of day, wherein the processing means is operative to couple one of the plurality of inputs to the equalization input and to vary the attenuation/boost of the variable equalization circuit when the time of day is equal to or past a stored time of day stored in the memory, the coupling of one of the plurality of inputs and the varying of the attenuation/boost being done according to parameters stored in the memory. Although the present invention comprehends equilization circuits which are active (attentuation and gain) or passive (attenuation only), the specification and claims shall refer only to attentuation for ease of description. It is intended, therefore, that "attentuation" as used herein comprehends both equalization attentuation or equalization gain or boost.

In another form of the invention, an audio selection circuit having time selectable equalization is disclosed, comprising an input for coupling the audio selection circuit to an audio signal source, a variable equalization circuit coupled to the input and having an equalization output, the variable equalization circuit providing variable attenuation in a plurality of frequency bands to an audio signal coupled to the input, a processing means operatively coupled to the input and to the variable equalization circuit, a memory means operatively coupled to the processing means and a timebase means operatively coupled to the processing means, the timebase means enabling the processing means to determine a time of day, wherein the processing means is operative to vary the attenuation of the variable equalization circuit when the time of day is equal to a stored time of day stored in the memory, the varying of the attenuation being done according to parameters stored in the memory.

In another form of the invention, a method of time selectable equalization of an audio signal is disclosed, comprising the steps of (a) providing a plurality of inputs for coupling to a plurality of audio signal sources, (b) providing a variable equalization circuit having an equalization input and an equalization output, the variable equalization circuit providing variable attenuation in a plurality of frequency bands to an audio signal coupled to the equalization input, (c) inputting a data set into a memory, the data set comprising an activating time of day, a selected input source indicating one of the plurality of inputs, and stored variable attenuation parameters, (d) determining an actual time of day, (e) coupling the selected input source to the equalization input when the actual time of day is equal to or past the activating time of day, and (f) adjusting the variable equalization circuit such that the variable attenuation corresponds to the stored variable attenuation parameters when the actual time of day is equal to or past the activating time of day.

In another form of the invention, a method of time selectable equalization of an audio signal is disclosed, comprising the steps of (a) providing an input for coupling to an audio signal source, (b) providing a variable equalization circuit having an equalization input and an equalization output, the variable equalization circuit providing variable attenuation in a plurality of frequency bands to an audio signal coupled to the equalization input, (c) inputting a data set into a memory, the data set comprising an activating time of day and stored variable attenuation parameters, (d) determining an actual time of day, (e) adjusting the variable equalization circuit such that the variable attenuation corresponds to the stored variable attenuation parameters when the actual time of day is equal to or past the activating time of day.

BRIEF DESCRIPTION OF THE DRAWINGS

The novel features believed to be characteristic of the invention are set forth in the appended claims. For a more complete understanding of the present invention, and for further details and advantages thereof, reference is now made to the following Detailed Description taken in conjunction with the accompanying drawings, in which:

Figure 1:
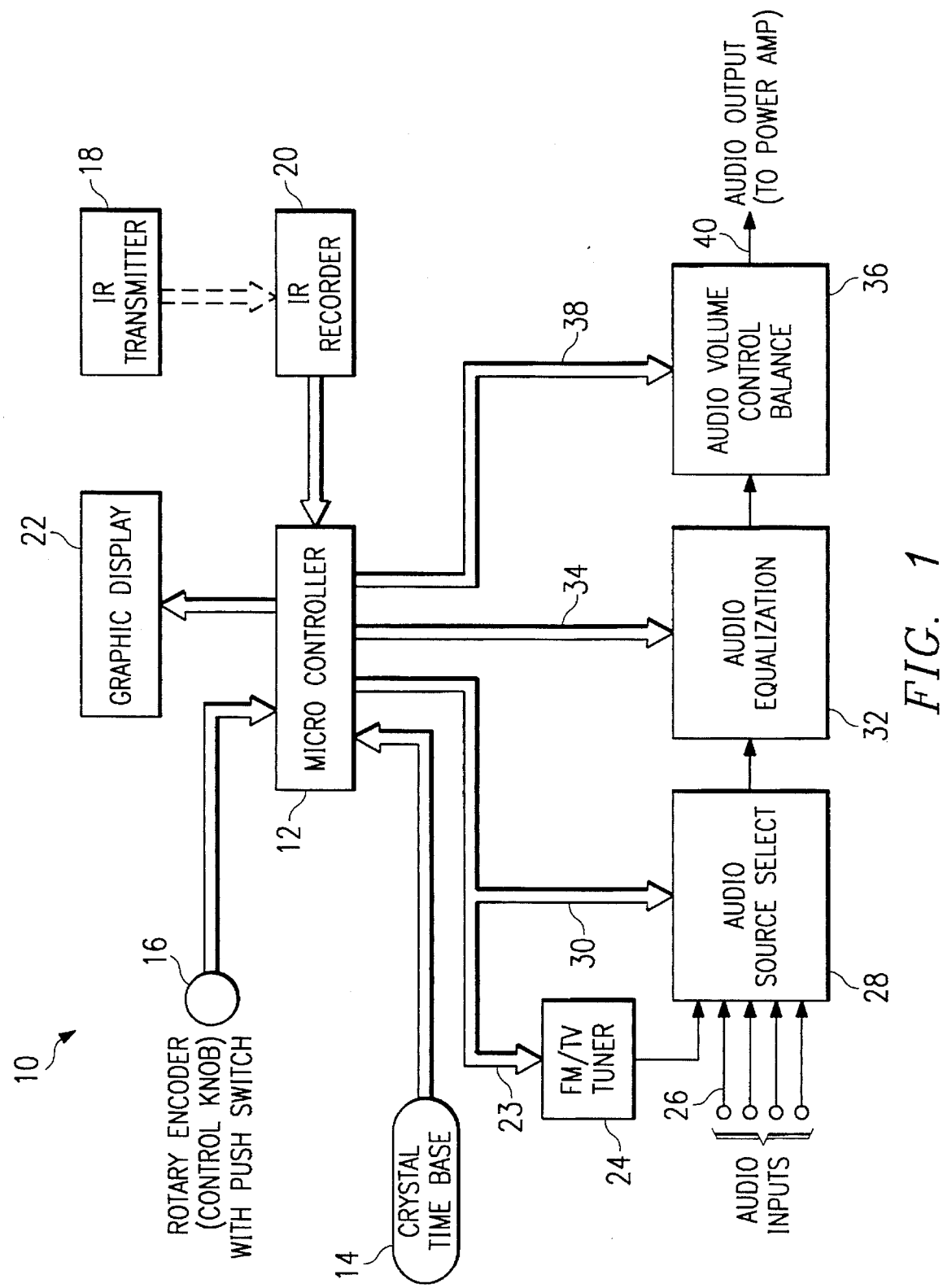
FIG. 1 is a schematic block diagram of a first embodiment of the present invention.

It is to be expressly understood, however, that the drawings are for purposes of illustration only and are not intended as a definition of the limits of the invention. Such definition is made only by the appended claims.

DETAILED DESCRIPTION OF THE DRAWINGS

The present invention relates to an audio selection circuit with time selectable equalization. A first embodiment of the present invention is illustrated schematically in FIG. 1, and indicated generally at 10. Audio equalization controller 10 is controlled by a programmable microcontroller 12. Input to the microcontroller 12 for providing accurate time-of-day information is provided by crystal time base 14. User input to the microcontroller 12 is provided by rotary encoder 16 or infrared transmitter 18 and associated receiver 20. Rotary encoder 16 provides output signals upon rotation of its associated knob in the form of two digital signals indicating magnitude and direction of rotation, and further provides pulse information by a pushbutton switch formed integrally with the rotary encoder 16. Rotary encoder 16 may be, for example, a model 61C11-01-08-02 manufactured by Grayhill, or a model OE1-32, manufactured by Oak Grigsby of Sugar Grove, Ill. Infrared transmitter/receiver 18/20 may be used to supply the same information as rotary encoder 16 as is commonly known in the art. Infrared transmitter/receiver 18/20 allows programming and control of the device 10 when the operator is not physically next to the device 10, but is still within a predetermined maximum line-of-sight range from device 10. Graphic display 22 receives output from microcontroller 12 in order to display, for example, the status of the device or to prompt the user for required input information. Graphic display 22 may be, for example, model DMC-16187NY-LY manufactured by Optrex or model MDL-16166 manufactured by Varitronix of Kawlaon, Hong Kong.

Control outputs 23 from the microcontroller 12 may be connected to a tunable device 24, such as an FM or television tuner for example, in order to allow the microcontroller 12 to select the tuned channel according to its internal program. Tunable device 24, as well as inputs from other audio and/or video sources 26 are coupled to audio source select circuit 28. Audio source select circuit 28 is responsive to control outputs 30 from microcontroller 12 to select one of the inputs 24, 26 for output to audio equalization circuitry 32. Audio equalization circuitry 32 is responsive to control outputs 34 from microcontroller 12 to adjust the equalization of the selected inputs 24, 26 according to the program of the microcontroller 12. The equalized audio signal from audio equalization circuitry 32 is output to volume/balance control circuitry 36. Volume/balance control circuitry 36 is responsive to control outputs 38 from microcontroller 12 to adjust the volume as well as the left/right stereo balance of the equalized signal. Audio output 40 from volume/balance control circuitry 36 is made available for connection to an external power amplifier.

Figure 2A:
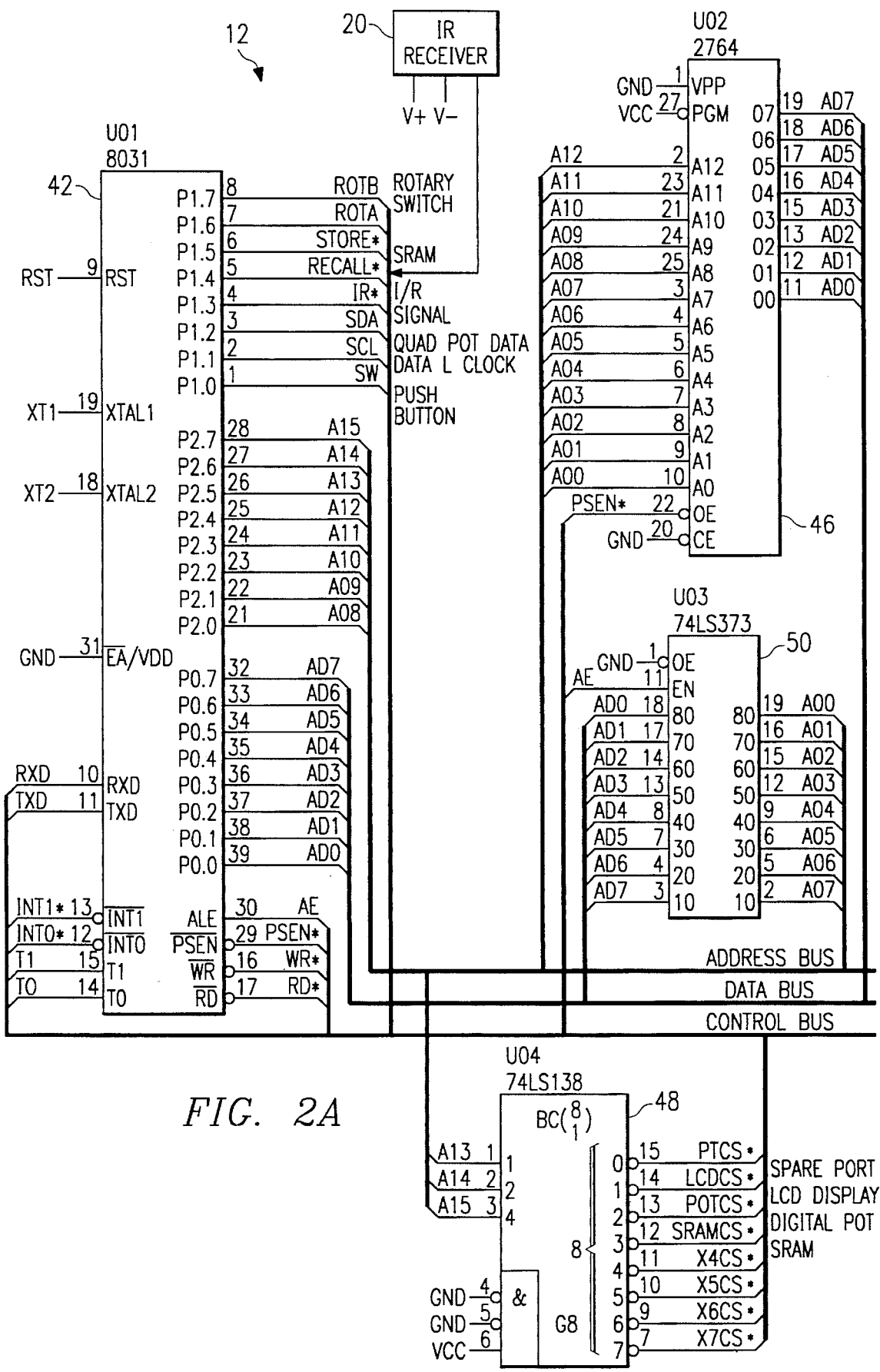
FIGS. 2a–c are a schematic block diagram of a first embodiment of the microcontroller of the present invention.
Figure 2B:
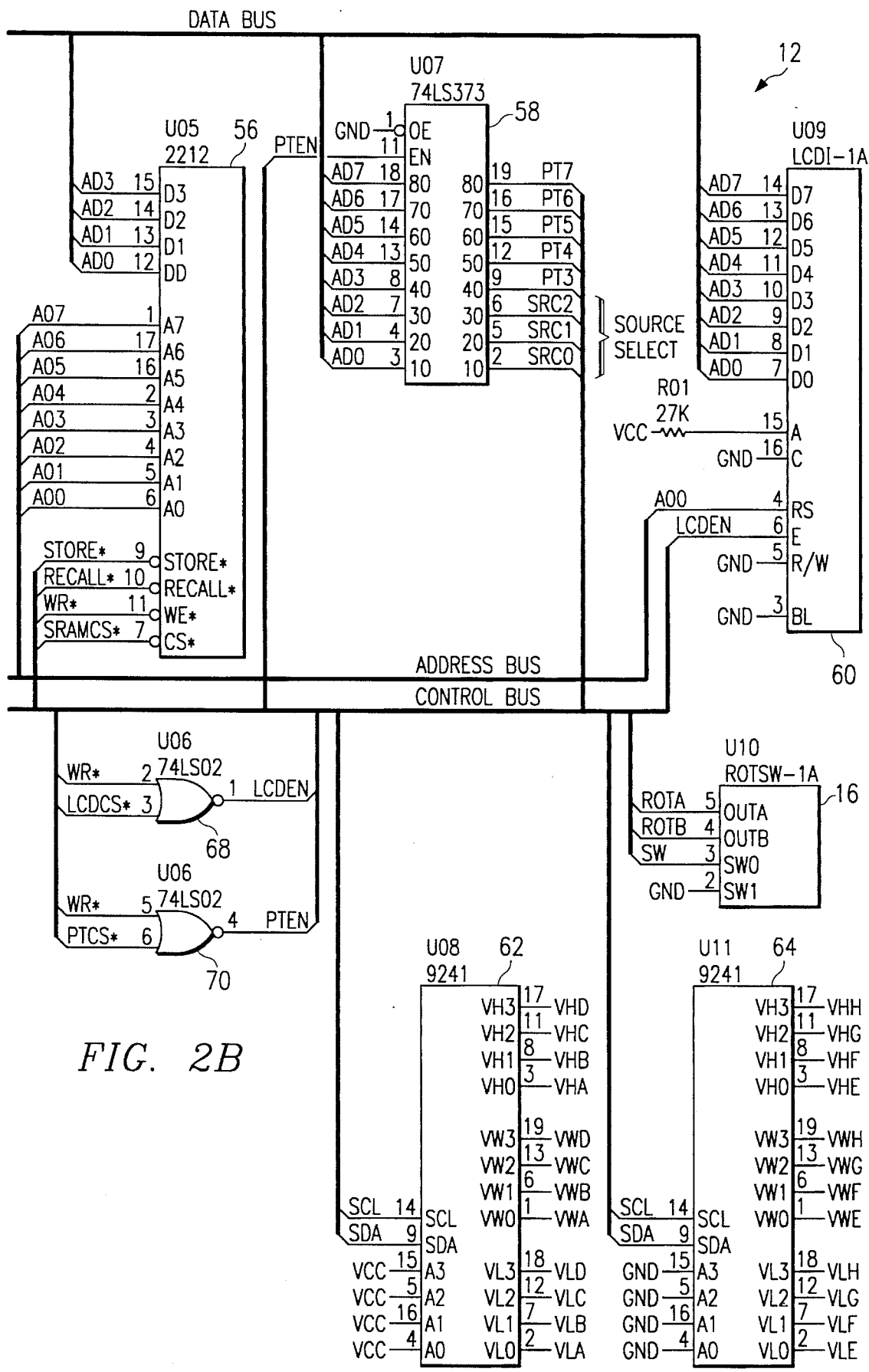
Figure 2C:
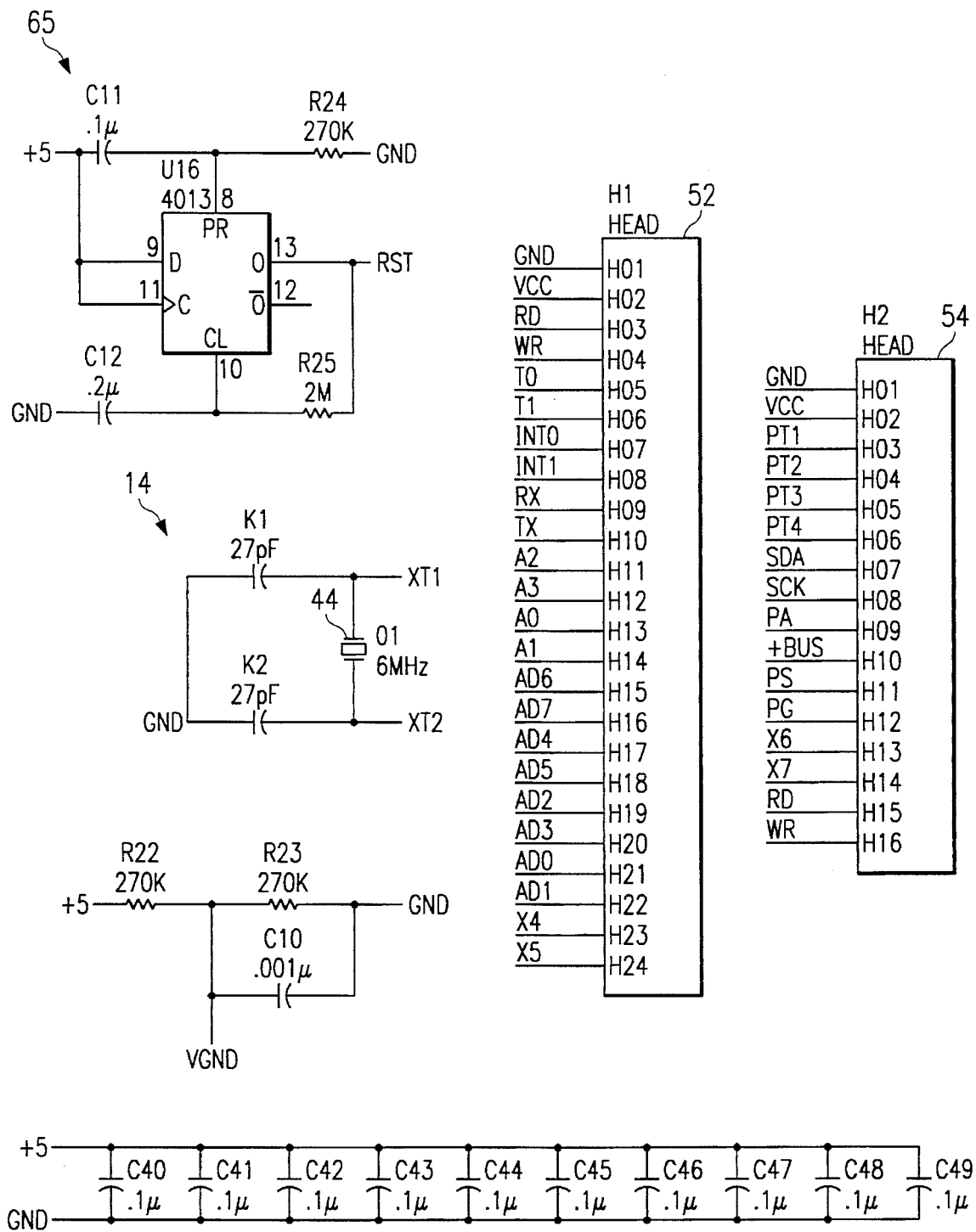

Microcontroller 12 is illustrated in more detail in FIGS. 2a–c. Microcontroller 12 is centered around a programmable controller 42 which may be, for example, an 8031 or 8052 microcontroller manufactured by Intel. Crystal time base 14 (see FIG. 2c) is provided by crystal 44 which oscillates at, for example, 6 megahertz (MHz). This accurate time base, coupled with software running on the microcontroller 42, provides day-of-week and time-of-day information as is known in the art. Input to the microcontroller 42 is made from infrared (IR) receiver 20. IR receiver 20 may be an LT1033-ND manufactured by Liteon, for example. Programmable read only memory (PROM) 46 is coupled to microcontroller 42 via control, address and data buses. PROM 46 may be a model 27C64 manufactured by Hitachi, for example. Address decoder 48 is controlled by the high 3 bits of the address bus and may be a 74LS138 manufactured by National Semiconductor, for example. Address decoder 48 places various control signals onto the control bus. Data latch 50 latches address data from the data bus onto the address bus. Data latch 50 may be a 74LS373 manufactured by National Semiconductor, for example. Various control, address and data lines are coupled to multipin connectors 52 and 54 for later expansion of the system 12 (see FIG. 2c).

The address, data and control buses continue in FIG. 2b, where non-volatile memory 56 receives data from the data bus, address information from the address bus and control signals from the control bus. Non-volatile memory 56 may be a model 2212 manufactured by XICOR, for example. Data latch 58 accepts input data from the data bus and produces source select control outputs coupled to the control bus. Control inputs to the quad potentiometers 62 and 64 are provided directly from the microcontroller 42, for example P1.1 and P1.2 outputs of the microcontroller. Data latch 58 may be a 74LS373 manufactured by National Semiconductor, for example. Liquid crystal display 60 is controlled via data from the data bus and is used to display various system information to the user. Liquid crystal display 60 may be a MDLS- 16166 manufactured by Varitronix, for example. Control for the system equalizers (see FIG. 3) are provided by two quad potentiometers 62 and 64. Potentiometers 62 and 64 may be model 9241 manufactured by XICOR, for example. Further control for the circuit of FIG. 3 is provided by digital audio potentiometer 66, which may be a model 1666 manufactured by Dallas Semiconductor, for example. NOR gates 68 and 70 are used to construct the enable signals for the liquid crystal display 60 and the data latch 58. NOR gates 68 and 70 may be model 74LS02 quad NOR gates, manufactured by National Semiconductor, for example. A system reset signal is generated by D-type flip-flop 65 (see FIG. 2c) for example, a CD4013 from Fairchild.

Referring now to FIGS. 3a–d, there is illustrated a schematic diagram of the audio source select circuit 28, the audio equalization circuit 32 and the audio volume control circuit 36 of FIG. 1. Audio inputs 24, 26 are input to digitally controlled analog switch 100, which selects the designated audio input for processing by the audio equalization circuit 32. Switch 100 may be, for example, a model CD4051 manufactured by Fairchild. The selected audio signal is amplified by operational amplifier 102 and input to an eight channel equalization circuit. Amplifier 102 may be, for example, ¼ of a quad operational amplifier integrated circuit, such as model number TL084, manufactured by Texas Instruments. It will be appreciated by those skilled in the art that the first embodiment of the present invention comprises an eight channel equalization circuit by way of example only, and that the number of channels is a mere design choice. The eight channel equalization device may be, for example, constructed of discrete devices such as operational amplifiers, resistors and capacitors, as is known in the art. The equalization device is a collection of band pass active filters, mixed by the operational amplifier 112 at 36 (see FIG. 3d). Each of the eight equalization channels contains a respective amplifier 104a–h with associated bias and feedback circuitry. The input to each of the amplifiers 104a–h is bandpass filtered so that only a portion of the selected audio signal is received and amplified by the respective amplifier 104a–h. In this manner, controlling the amplification provided by each of the amplifiers 104a–h results in a predictable equalization profile across the entire frequency spectrum of the selected audio signal. The center frequency of each bandpass filter is determined by the values of the two respective capacitances C1 and C2. Table 1 relates the capacitance values and center frequencies for each of the channels in a first embodiment of the present invention.

TABLE 1

| Channel | Filter Capacitor Values | | |
|---|---|---|---|
| | $F_o$ (Hz) | C1 | C2 |
| 1 | 60 | .1 mF | .01 mF |
| 2 | 120 | .047 mF | 4700 pF |
| 3 | 250 | .022 mF | 2200 pF |
| 4 | 500 | .001 mF | 1000 pF |
| 5 | 800 | 6800 pF | 680 pF |
| 6 | 1.2 k | 4700 pF | 470 pF |
| 7 | 2.4 k | 2200 pF | 220 pF |
| 8 | 6.0 k | 1000 pF | 100 pF |

The respective amplification factor of each of the amplifiers 104a–h is controlled by the resistances placed across respective terminals 106a–h, 108a–h and 110a–h. These resistance values are produced by the equalization outputs of potentiometers 62 and 64 of FIG. 2b. The microcontroller 42 causes the wiper $V_W$ of each equalization channel to move toward $V_L$ or $V_H$. The microcontroller 42 sends a data word to each potentiometer 62 and 64, causing them to close an associated switch in a resistor network in order to move the wiper $V_W$. As $V_W$ moves toward $V_H$, reducing the resistance between them, the gain for the respective equalization channel is increased. Conversely, as $V_W$ moves toward $V_L$, decreasing the resistance between them, the gain for the respective equalization channel is decreased. The outputs from each of the amplifiers 104a–h are combined back into a composite audio signal and input to mixing amplifier 112, which may be, for example, ½ of a model TL082 dual operational amplifier, manufactured by Texas Instruments. The amplification factor (final volume) of amplifier 112 is controlled by a variable resistance placed on terminals 114, 116 and 118. This variable resistance is created by digital potentiometer 66 (see FIGS. 2B and 3d), which may be, for example, a model 1666 manufactured by Dallas Semiconductor.

Figure 3A:
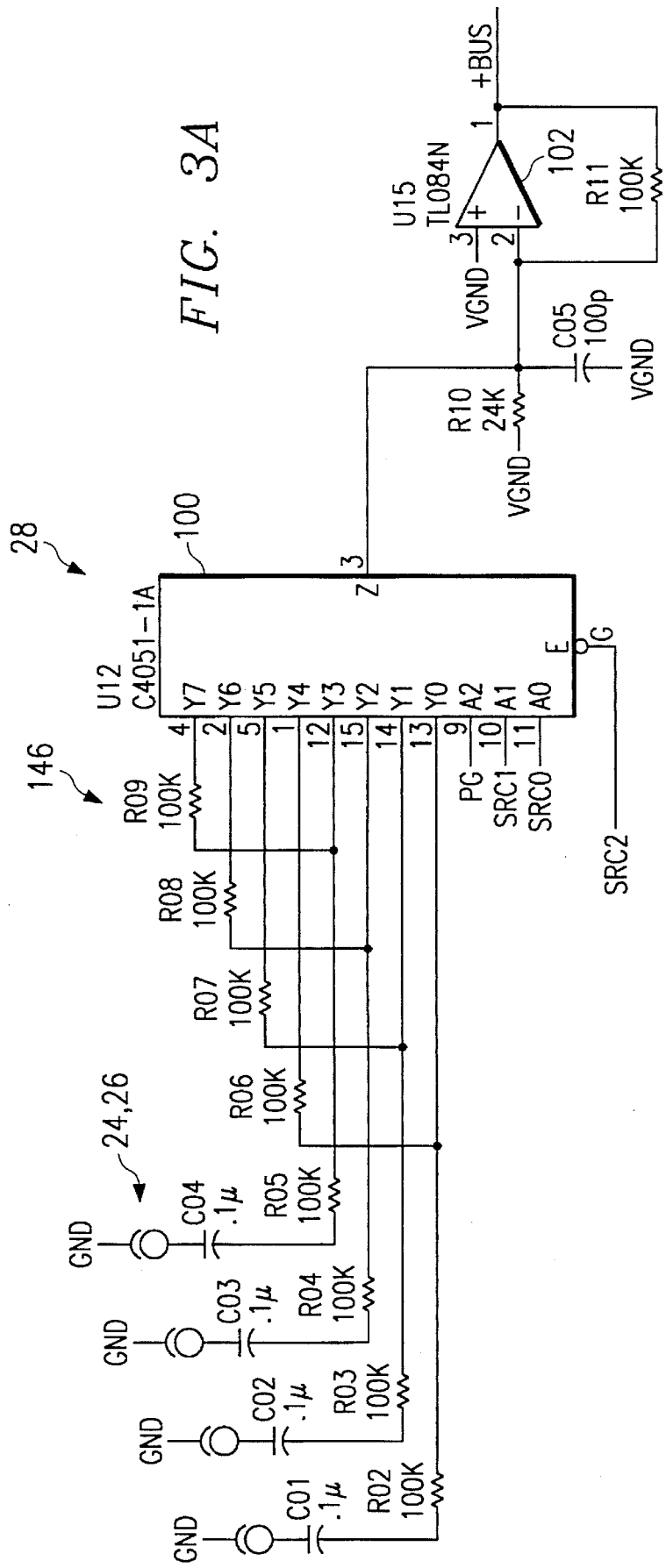
FIGS. 3a–d are a schematic diagram of the audio source select, audio equalization and audio volume/balance control circuits of the present invention.
Figure 3B:
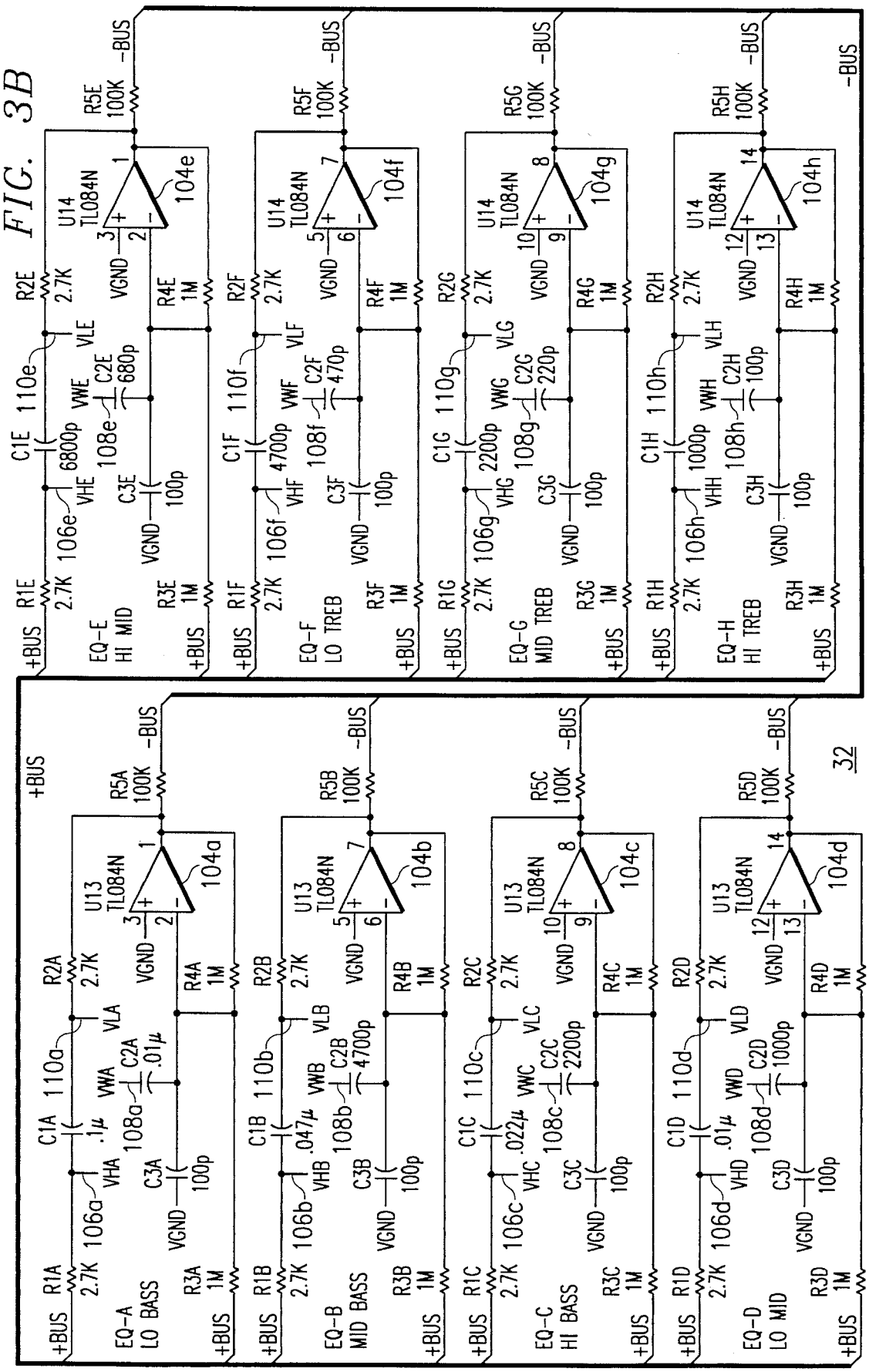
Figure 3C:
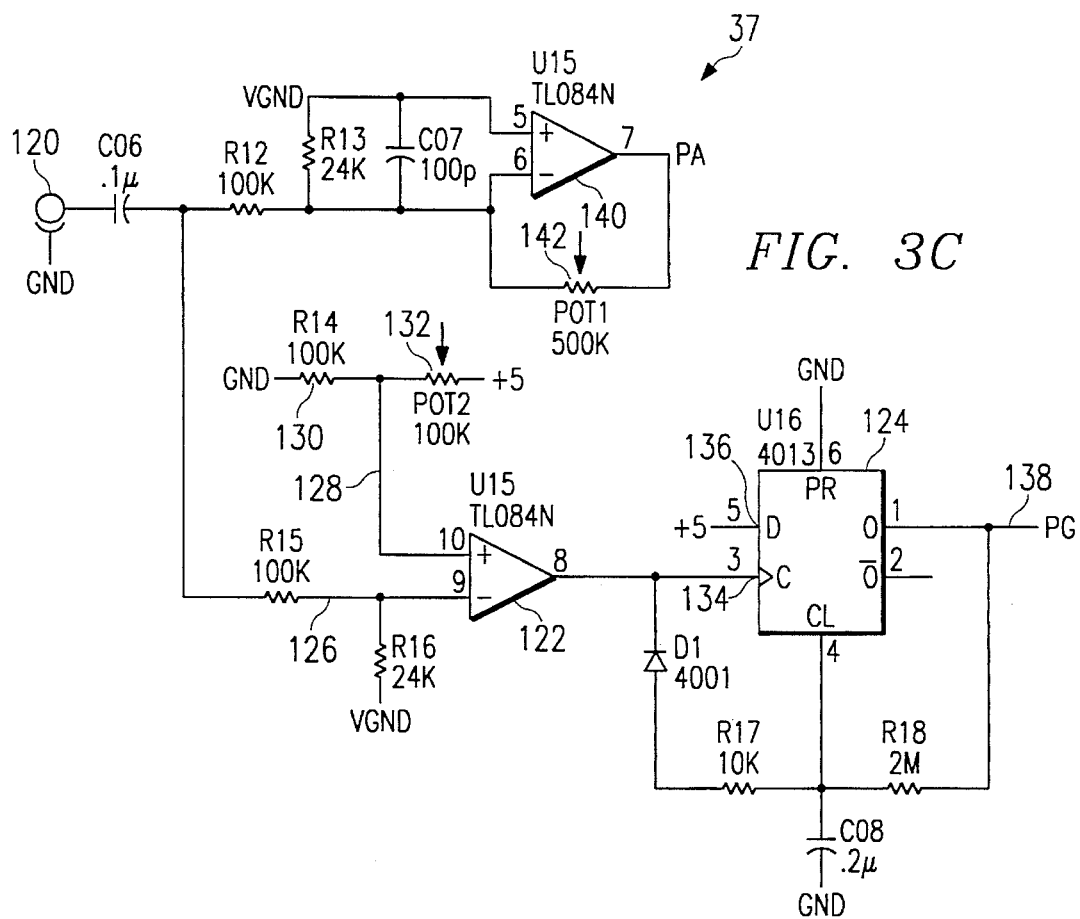
Figure 3D:
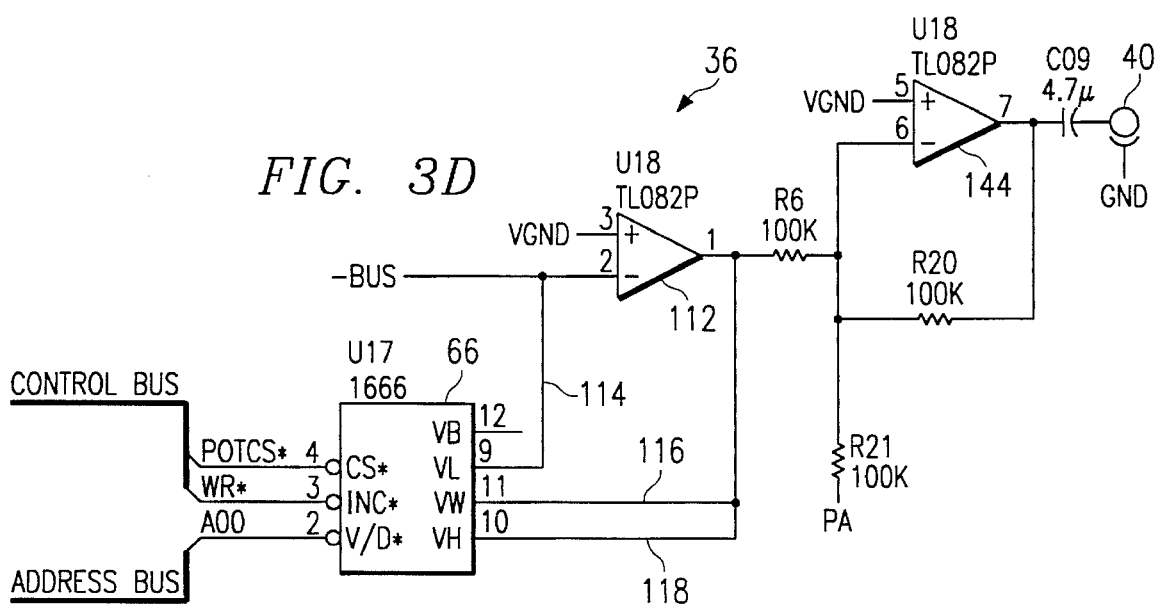

A microphone input is provided at terminal 120 (see FIG. 3c). In a setting such as a restaurant or bar, it is desirable to have a microphone input to the audio system so that reservation announcements and the like may be broadcast. When the microphone input is activated, it is also desirable to automatically attenuate the currently selected audio signal during the period of active microphone input so that the announcement may be easily heard over the audio program. Such a function is provided by the volume/balance control circuit 37 by the use of comparator 122 and data flip-flop 124. Comparator 122 receives at terminal 126 a signal from the microphone input at terminal 120. Terminal 128 of comparator 122 receives a variable threshold signal that is produced by application of voltages v− and v+ to a voltage divider network consisting of resistor 130 and adjustable potentiometer 132. In a first embodiment, v− 0 V. and v+ is +5 V. (audio ground is ½[(v+)−(v−)]), resistor 130 is 100k Ohms and potentiometer 132 is 100k Ohms. By adjusting the resistance value of potentiometer 132, the voltage level of terminal 128 may be adjusted, and therefore the threshold above which the microphone signal appearing at terminal 120 must pass is determined. The output of comparator 122 is input to data flip-flop 124 at clock input 134. A voltage of v+ is applied to the data input 136 of flip-flop 124, therefore the Q output 138 will always be a logical one except when the microphone input is above the threshold determined by potentiometer 132, in which case the Q output 138 will be a logical zero. The Q output is used as the PG input to switch 100, which causes the normally selected input audio signal 24, 26 to be routed through respective additional 100k resistors 146 so that the audio input enters at inputs 4, 5, 6 or 7 of switch 100, rather than inputs 0, 1, 2 or 3. This causes the audio gain to be reduced by approximately 50%. The microphone signal is preamplified at preamplifier 140 which allows for adjustable gain (volume control) by adjustment of feedback potentiometer 142. The output of preamplifier 140 is input to an output amplifier 144. Output amplifier 144 mixes the source audio (reduced by 50%) with the microphone signal. Amplifier 144, which may be, for example, ½ of a model TL082 dual operational amplifier, manufactured by Texas Instruments, produces the final output 40 from the audio volume control circuitry. As shown in FIG. 1, this output 40 is designed to be an input to an external power amplifier that will drive the audio system's speakers. It will be appreciated by those skilled in the art that the circuit of FIGS. 3a–3d is monophonic, and that the incorporation of a stereophonic signal with balance control requires the addition of a second, complimentary set of equalization channels and mixing amplifiers. The balance between the stereo channels may then be controlled by software operating the volume controls of both stereo channels.

Figure 4A:
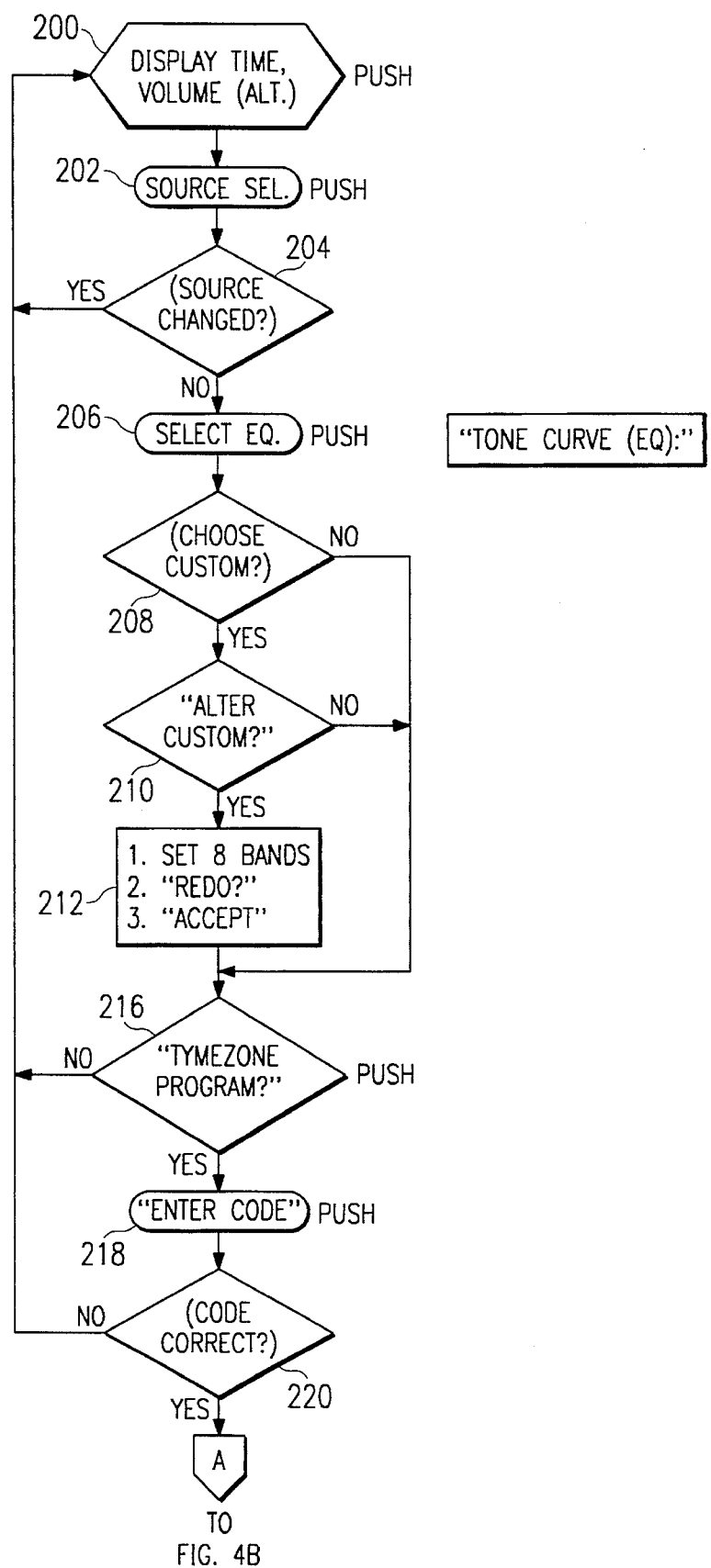
FIGS. 4a and 4b are a process flow diagram of the operation of the present invention.
Figure 4B:
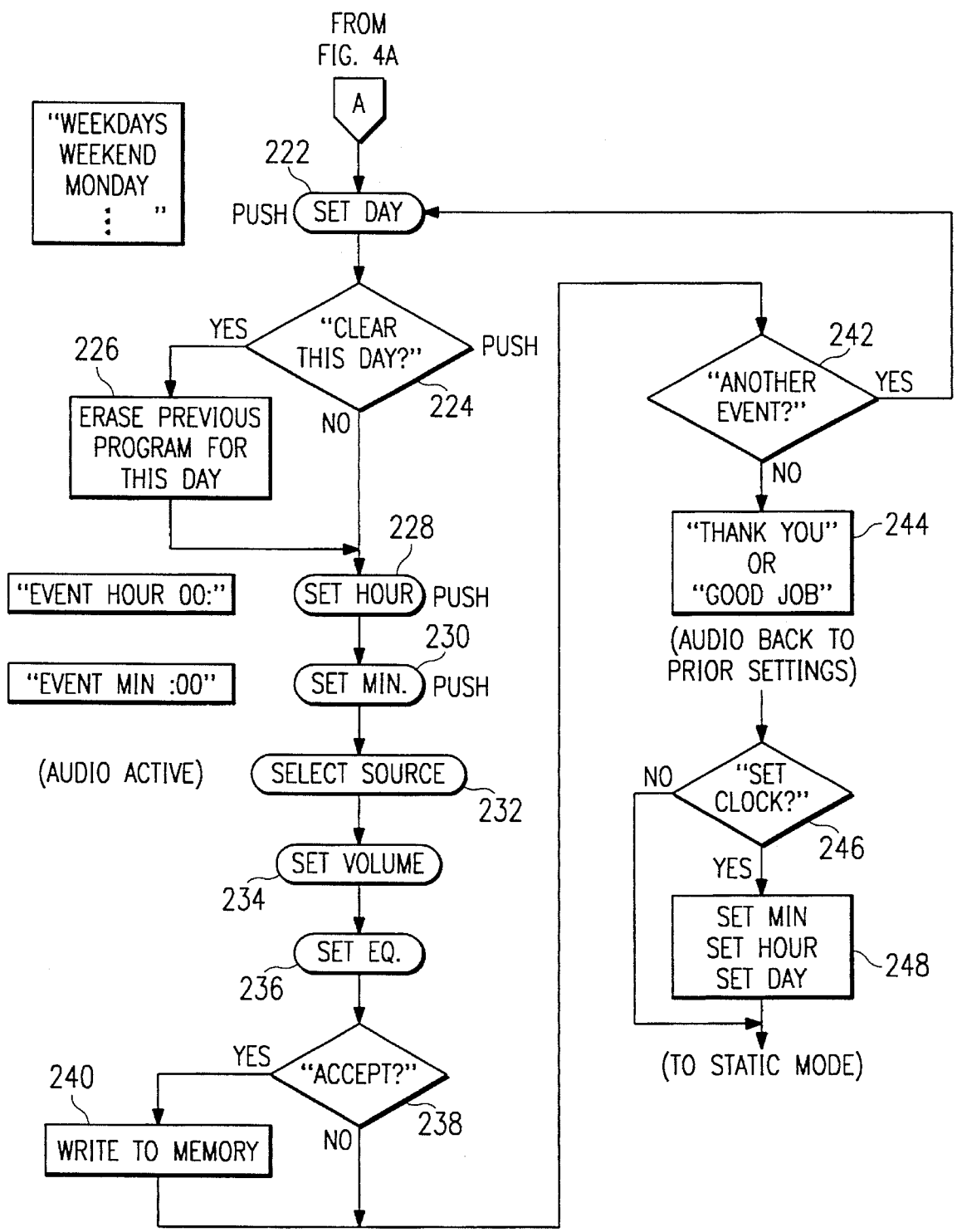

Referring now to FIGS. 4a and 4b, there is illustrated a process flow diagram detailing the operation of the first embodiment of the present invention by use of the rotary encoder 16 on its front panel. At step 200, the device 10 is in a static mode, and the graphic display 22 gives status information by alternating between a display of the time and volume, for example. At this point, rotation of the rotary encoder 16 operates to change the broadcast volume of the selected audio source 24, 26. Pushing rotary encoder 16 moves the process to step 202 which allows for a new audio source 24, 26 to be selected as the active source. Rotation of the rotary encoder will produce a succession of audio input labels on the display 22. When the desired audio input source appears on the display 22, the user pushes the rotary encoder 16 to select that source as the new active source. Decision point 204 determines if the selected audio source was changed at step 202. If it was, the process returns to step 200. If a different audio source was not selected, the process continues to step 206 to select the desired audio equalization profile. Rotation of the rotary encoder will produce a succession of predetermined audio equalization profiles which are stored in the memory of microcontroller 12. Any of these predetermined audio equalization profiles may be selected by pushing the rotary encoder 16. Also displayed on the list of choices is the option of entering a custom equalization profile.

When the rotary encoder 16 is pushed at step 206, the process continues to decision point 208 to determine if the custom equalization option was selected. If the user chose to enter a custom equalization profile, the process must determine if the user wishes to use the currently stored custom equalization profile or enter a new custom equalization. This is done at step 210, which asks if the user wishes to alter the custom equalization. If the user chooses "yes," the process continues to step 212 which displays the first of the eight equalization bands on graphic display 22. The user may change the setting for the current equalization band by rotation of the rotary encoder 16. When the desired setting for the displayed equalization band is reached, the user pushes the rotary encoder to bring up the next equalization band. This procedure is continued for each of the eight frequency equalization bands. Once all of the eight bands have been selected, the user is prompted to decide if he wishes to redo the equalization setting procedure. Rotation of the rotary encoder 16 switches the display from "YES" to "NO" and pushing the rotary encoder 16 selects the currently displayed answer. If the user does not wish to redo the selected equalization bands, he is then prompted to decide if he wishes the process to accept the changes as permanent (to be stored in memory). If the user indicates that the changes to the custom equalization profile are permanent, the profile is updated in the memory associated with the microcontroller 12, otherwise the settings remain active without being stored.

After completing the changes to the custom equalization profile, or if it was determined that a standard equalization profile was chosen at step 208, or if it was decided that the custom profile was not to be altered at step 210, the process continues at decision point 216, where the user is prompted to indicate if he wishes to write a new user program (enter an "event"). A user program allows the user to indicate a succession of different audio source selection changes, volume changes and equalization profile changes to occur over a specified time period automatically. The user enters the time and day at which each change is desired as well as the required change. The microcontroller 12 will continuously compare the current time and day to the programmed change points and execute the programmed changes when required. If, at step 216, the user does not wish to write a program, he rotates rotary encoder 16 until "NO" is displayed and then pushes the encoder 16, returning the process to step 200. However, if the user wishes to write a new program, he rotates rotary encoder 16 until "YES" is displayed and pushes the encoder, advancing the process to step 218 which prompts the user to enter an access code. The access code is required in order to keep unauthorized users, such as general restaurant personnel, from changing the program. The user uses the rotary encoder to enter the access code, and the process, at decision point 220, determines whether a valid access code was entered. If the entered code was not valid, the process returns to step 200.

Referring now to FIG. 4b, if a valid access code was entered at step 218, the process advances to step 222, which prompts the user to enter which day of the week the new program is for. For example, the new program may be activated at the programmed time on weekdays only, weekend days only, or on any specifically chosen day. This feature allows for different settings to be programmed for each day individually, or for a "weekday" setting to be programmed which is geared toward quick breakfasts, business lunches, and later dinners, while a separate "weekend" program may be entered which is geared toward extended "brunch" hours and more leisurely meals. The various day options are sequenced through on the display and pushing the rotary encoder 16 selects the displayed selection. Decision point 224 asks the user if he desires to erase the previous program for this day. If the user selects not to erase the entire program for this day that was previously stored, the new information to be added is merged with the old information stored for that day. For instance, if the old program for the selected day required changes at 8 AM and 4:30 PM, and this program was not erased, entering new information with a selected time of 12 PM would result in a new program that activated the indicated sources and equalization profiles at 8 AM, 12 PM and 4:30 PM. On the other hand, if the old program for the selected day were erased, the process would activate the indicated source only at 12 PM. If the user selects the option of erasing the previous program, the process continues at step 226 where the program previously stored for the selected day is erased. The program then continues to step 228 where the time (hour) for the new program activation is to be set. Rotation of the rotary encoder 16 changes the hour displayed, while pushing the rotary encoder 16 selects the displayed hour. At this point, the process continues to step 230 where the minutes for the desired program activation are similarly selected. Next, step 232 allows the user to select the audio source to be activated at the entered time. The display cycles through a list of available audio sources when the rotary encoder 16 is rotated, and pushing the rotary encoder 16 selects the displayed audio source. At this point, the selected audio source is activated so that it is presented to the audio output 40.

At step 234, the user selects the desired volume by rotating the rotary encoder 16 until a satisfactory volume is achieved, and then pushing rotary encoder 16 to select that volume. The process then advances to step 236 where the user may select the equalization profile to be applied to the chosen audio input. This portion of the process is analogous to process steps 206–212. Next, decision point 238 asks the user if he wishes to accept the chosen settings. The display cycles between "YES" and "NO" with rotation of the rotary encoder and pushing the rotary encoder selects the displayed answer. If "YES" is chosen, the newly entered parameters are stored in memory at step 240. The process then continues at decision point 242, which prompts the user to decide if another event is to be programmed. If the user selects "YES," the process returns to step 222, otherwise it continues to step 244 where a "THANK YOU" or "GOOD JOB" message is displayed on graphic display 22 in order to let the user know that the updating process is over. Also at this point, the prior active audio settings are restored and the process returns to decision point 246, where the user is prompted to set the clock. If the user chooses to set the clock, step 248 allows him to enter the minute, hour and day by a process analogous to steps 222, 228 and 230. The process then returns to step 200.

It will be appreciated by those skilled in the art that the present invention allows for the novel ability to alter the equalization settings of a selected audio input source at different times of the day on different days of the week by a preprogammed control system. The use of such a system can provide for gradual or abrupt changes in the ambient audio environment, thereby enhancing the effectiveness of such audio sources in creating various background settings.

Although preferred embodiments of the present invention have been described in the foregoing Detailed Description and illustrated in the accompanying drawings, it will be understood that the invention is not limited to the embodiments disclosed, but is capable of numerous rearrangements, modifications, and substitutions of parts and elements without departing from the spirit of the invention. For example, it is contemplated that the user programmed parameters of the present invention may be entered into the microcontroller 12 memory via an RS-232 port or the like through the use of a personal computer. Similarly, such a downloading or uploading may be performed through the use of modem in order to connect a device 10 and a personal computer which are remotely located. Also, it is contemplated that the access code feature could be inserted in other portions of the instruction sequence to restrict unauthorized users from various levels of operation. Accordingly, the present invention is intended to encompass such rearrangements, modifications, and substitutions of parts and elements as fall within the scope of the appended claims.

What is claimed is:

1. An audio selection circuit having time selectable equalization, comprising:

a variable equalization circuit having an equalization input and an equalization output, said variable equalization circuit providing variable attenuation in a plurality of frequency bands to an audio signal coupled to said equalization input;

processing means operatively coupled to said variable equalization circuit;

memory means operatively coupled to said processing means; wherein said memory means stores data, said data consisting essentially of an equalization profile or profiles and an activating time of day, and timebase means operatively coupled to said processing means, said timebase means enabling said processing means to determine a time of day;

wherein said memory means is indexed by said time of day allowing said processing means to alter said audio signal according to an equalization profile read from said memory means when said time of day is equal to or past a predetermined time of day.

2. The audio selection circuit of claim 1 wherein said variable equalization circuit additionally provides variable gain in said plurality of frequency bands to said audio signal coupled to said equalization input.

3. The audio selection circuit of claim 1 wherein said variable equalization circuit comprises a plurality of active bandpass filters coupled in parallel.

4. The audio selection circuit of claim 1 wherein said variable equalization circuit comprises two stereo channels, each of said stereo channels having a separate equalization input and a separate equalization output.

5. The audio selection circuit of claim 1 wherein said processing means comprise a digital microprocessor.

6. An audio selection circuit having time selectable equalization, comprising:

an input for coupling said audio selection circuit to an audio signal source;

a variable equalization circuit coupled to said input and having an equalization output, said variable equalization circuit providing variable attenuation in a plurality of frequency bands to an audio signal coupled to said input;

a processing means operatively coupled to said input and to said variable equalization circuit;

a memory means operatively coupled to said processing means; wherein said memory means stores data, said data consisting essentially of a sequence of equalization profiles and an activating time of day, and a timebase means operatively coupled to said processing means, said timebase means enabling said processing means to determine a time of day; wherein said memory means is indexed by time of day;

wherein said processing means varies the equalization of said audio signal with each of said sequence of equalization profiles when said time of day is equal to a predetermined time of day.

7. The audio selection circuit of claim 6 wherein said variable equalization circuit additionally provides variable gain in said plurality of frequency bands to said audio signal coupled to said input.

8. The audio selection circuit of claim 6 wherein said variable equalization circuit comprises a plurality of active bandpass filters coupled in parallel.

9. The audio selection circuit of claim 6 wherein said variable equalization circuit comprises two stereo channels, each of said stereo channels having a separate input and a separate equalization output.

10. The audio selection circuit of claim 6 wherein said processing means comprise a digital microprocessor.

11. A method of time selectable equalization of an audio signal, comprising the steps of:

(a) providing an input for coupling to an audio signal source;

(b) providing a variable equalization circuit having an equalization input and an equalization output, said variable equalization circuit providing variable attenuation in a plurality of frequency bands to an audio signal coupled to said equalization input;

(c) inputting a data set into a memory, said data set consisting essentially of an equalization profile and an activating time of day;

(d) determining an actual time of day;

(e) indexing said memory to retrieve said equalization profile when said actual time of day is equal to or past a predetermined time of day.

12. The method of claim 11 wherein step (d) is performed by periodically referencing a crystal time base.

* * * * *